US010219334B2

(12) United States Patent
Busse et al.

(10) Patent No.: US 10,219,334 B2
(45) Date of Patent: Feb. 26, 2019

(54) CIRCUIT ARRANGEMENT FOR OPERATING SEMICONDUCTOR LIGHT SOURCES

(71) Applicant: OSRAM GmbH, Munich (DE)

(72) Inventors: Olaf Busse, Munich (DE); Alfons Lechner, Hohenwart (DE); Siegfried Mayer, Moosinning (DE); Horst Werni, Munich (DE); Christof Schwarzfischer, Wackersberg (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 15/550,037

(22) PCT Filed: Jan. 25, 2016

(86) PCT No.: PCT/EP2016/051453
§ 371 (c)(1),
(2) Date: Aug. 10, 2017

(87) PCT Pub. No.: WO2016/128206
PCT Pub. Date: Aug. 18, 2016

(65) Prior Publication Data
US 2018/0035499 A1 Feb. 1, 2018

(30) Foreign Application Priority Data
Feb. 10, 2015 (DE) ........................ 10 2015 202 370

(51) Int. Cl.
*H05B 33/08* (2006.01)
*H01L 29/16* (2006.01)
*H05B 37/02* (2006.01)

(52) U.S. Cl.
CPC ....... *H05B 33/0815* (2013.01); *H05B 33/083* (2013.01); *H05B 33/089* (2013.01); *H05B 33/0845* (2013.01); *H05B 37/0254* (2013.01)

(58) Field of Classification Search
CPC . H05B 33/083; H05B 33/0845; H05B 33/089
See application file for complete search history.

(56) References Cited

U.S. PATENT DOCUMENTS

2014/0009084 A1 1/2014 Veskovic
2015/0069925 A1* 3/2015 Van Der Veen ... H05B 33/0806 315/206

(Continued)

FOREIGN PATENT DOCUMENTS

DE 10 2005 003 682 A1 8/2006
DE 10 2013 201 438 A1 7/2014
WO 2014113827 A1 7/2014

OTHER PUBLICATIONS

German Search Report based on application No. 10 2015 202 370.2 (8 pages) dated Oct. 22, 2015 (for reference purpose only).

(Continued)

*Primary Examiner* — Dedei K Hammond
*Assistant Examiner* — Raymond R Chai
(74) *Attorney, Agent, or Firm* — Viering Jentschura & Partner MBB

(57) ABSTRACT

According to the present disclosure, a circuit arrangement for operating semiconductor light sources includes: a power input for inputting an AC input voltage, an output having a first output terminal, and a second output terminal, which is designed to connect a string of semiconductor light sources, a control input for controlling the operation of the circuit arrangement with a control signal, a rectifier circuit for converting the AC input voltage into a rectified voltage, a converter circuit for transforming the rectified voltage into a current which is suitable for the semiconductor light sources, a first switch arranged between the converter circuit and the output, for the switching of the current through the semiconductor light sources, and a first diode arranged (Continued)

between the first switch and the output, or between the converter circuit and the first switch.

16 Claims, 8 Drawing Sheets

(56) References Cited

U.S. PATENT DOCUMENTS

2015/0366015 A1 12/2015 Krummel
2016/0057825 A1* 2/2016 Hu .................... H05B 33/0815
315/201

OTHER PUBLICATIONS

International Search Report based on application No. PCT/EP2016/051453 (6 pages + 2 pages English translation) dated Apr. 29, 2016 (for reference purpose only).

* cited by examiner

CIRCUIT ARRANGEMENT FOR OPERATING SEMICONDUCTOR LIGHT SOURCES

RELATED APPLICATIONS

The present application is a national stage entry according to 35 U.S.C. § 371 of PCT application No.: PCT/EP2016/051453 filed on Jan. 25, 2016, which claims priority from German application No.: 10 2015 202 370.2 filed on Feb. 10, 2015, and is incorporated herein by reference in its entirety.

TECHNICAL FIELD

The present disclosure relates to a circuit arrangement for operating semiconductor light sources, having a power input for inputting an AC input voltage, an output having a first output terminal, and a second output terminal, which is designed to connect a string of semiconductor light sources, a control input for controlling the operation of the circuit arrangement with a control signal, a rectifier circuit for converting the AC input voltage into a rectified voltage, and a converter circuit for transforming the rectified voltage into a current which is suitable for the semiconductor light sources.

BACKGROUND

The present disclosure proceeds from a circuit arrangement for the operation of semiconductor light sources, of the generic type described in the main claim.

In many cases, state-of-the-art circuit arrangements for the operation of semiconductor light sources are not switched in the conventional manner, wherein they are turned on by the switching-in of the mains voltage and turned off by the switching-out of the mains voltage, but are permanently connected to the mains voltage, and are switched by means of a data bus such as, e.g. a DALI bus. The fact that these circuit arrangements are permanently connected to the mains voltage raises a problem which is known from the prior art. As a result of stray capacitances, the AC mains voltage can generate a small current in the semiconductor light sources, which causes the semiconductor light sources to glow, at least in part. Particularly in a dark environment, this glowing can be clearly perceived, and is undesirable. The current responsible for the glowing of semiconductor light sources is described hereinafter as the glow current $I_G$. From the prior art, measures are known which are intended to attenuate the glowing of semiconductor light sources in a switched-out circuit arrangement.

FIG. 2 shows a voltage $U_{EWN}$ which, notwithstanding the switching-out of a circuit arrangement 100 for the operation of semiconductor light sources, is present on the LED string 55, and results in the glowing of the LEDs 5 in the LED string 55. This voltage flows via stray capacitances in the LED string 55, although the circuit arrangement 100 for the operation of semiconductor light sources is not actively in service. This voltage can induce a small current in the light-emitting diodes 5 (typically of a value of 500 μA-1,000 μA), which causes the latter to glow. A glowing of the light-emitting diodes 5, at least in darkness, is visible with effect from a light-emitting diode current of 1 μA.

From FIG. 3, a known method is inferred for the reduction of the glowing of semiconductor light sources.

FIG. 3 shows a circuit arrangement according to the prior art, which already reduces the glowing of the LEDs 5. FIG. 3 represents the output section of the circuit arrangement in the switched-out state, with the semiconductor light sources glowing. The two output conductors LED+ and LED− herein are short-circuited on the input side, on the grounds that, for the e.m.f. $U_{EWN}$, the interconnection of the circuit arrangement at this point acts in the manner of a short-circuit.

From the prior art it is known that, between a DC voltage converter and the output terminal of the circuit arrangement, a diode 1 is connected in series. In itself, this substantially reduces the glow current, as practically no more current can flow in the blocking direction of the diode. The diode must be appropriate for this function, and must show the smallest possible stray capacitance.

In the light-emitting diode string 55, a protective diode 7 is connected in an antiparallel arrangement with each light-emitting diode 5, which is intended to protect the light-emitting diode 5 from excessively high blocking voltages. Light-emitting diodes are known to be highly sensitive to high blocking voltages, and can be easily destroyed as a result. Consequently, in practically every commercial light-emitting diode package, a protective diode 7 is connected to the LED chip 5 in an antiparallel arrangement. State-of-the-art light-emitting diodes are high-power modules which, on the grounds of their high power conversion capacity, generate substantial quantities of waste heat. As a result, these modules are customarily fitted to "metal-core printed boards". These are printed circuit boards which are essentially comprised of a good thermally-conductive sheet metal, generally aluminum or copper. A very thin insulating layer is applied to this sheet metal to which, in turn, known printed conductors are applied. As a result of the limited thickness of the insulating layer, very good thermal conduction to the metal core, i.e. to the sheet metal, is provided. Waste heat generated on the light-emitting diodes 5 can thus be evacuated very effectively. However, this thermal advantage is also associated with an electrical disadvantage: as a result of the limited thickness of the insulating layer, the entire arrangement acts as a capacitor, and specifically as a Y-capacitor, as the sheet metal, in the majority of arrangements, is grounded. These stray capacitances are represented in the circuit diagram in FIG. 3 as capacitors 9. Via these capacitors 9, a glow current can flow to ground, even with the circuit arrangement in the switched-out state.

In order to further reduce the glow current flowing in the light-emitting diode string 55, a MOSFET S1 is arranged between the DC voltage converter and the output terminal 124 which, during the operation of the circuit arrangement for operating semiconductor light sources, is switched-in, and is likewise switched-out, when the circuit arrangement for operating semiconductor switches is switched-out. This MOSFET S1 thus further suppresses the glow current in the forward direction of the light-emitting diodes 5. The diode 3 represented in FIG. 3 is the body diode of the MOSFET S1. A varistor 13 is connected in parallel with the drain-source gate of the MOSFET S1, in order to protect the MOSFET S1 against overvoltage pulses. Between the MOSFET S1 and the output terminal 124, a Y-capacitor 11 is arranged in the ground connection, which likewise reduces the glowing of the light-emitting diodes 5.

However, even in this known circuit arrangement, a glow current $I_G$, albeit weak, continues to flow in the light-emitting diodes 5. This is essentially attributable to the drain-source capacitance of the MOSFET switch S1 and, notwithstanding careful selection, also to the rather low resistance value and the high capacitance value of the varistor 13 which, even upon the application of a low voltage thereto, shows a rather low resistance value and a rather high stray capacitance. For technological reasons, the characteristic performance of available varistors is only conditionally suitable for the present application.

SUMMARY

The object of the present disclosure is the disclosure of a circuit arrangement for operating semiconductor light sources, wherein the glow current is further reduced, such that it is no longer perceptible, even in a dark environment.

This object is fulfilled according to the present disclosure by a circuit arrangement for operating semiconductor light sources, having a power input for inputting an AC input voltage, an output having a first output terminal, and a second output terminal, which is designed to connect a string of semiconductor light sources, a control input for controlling the operation of the circuit arrangement with a control signal, a rectifier circuit for converting the AC input voltage into a rectified voltage, a converter circuit for transforming the rectified voltage into a current which is suitable for the semiconductor light sources, a first switch arranged between the converter circuit and the output, for the switching of the current through the semiconductor light sources, and a first diode arranged between the first switch and the output, or between the converter circuit and the first switch. By the serial connection of the first switch and the diode, a four-quadrant switch is obtained which, advantageously, can effectively reduce glow currents flowing in the semiconductor light source string. As the diode 15 shows small stray capacitances, the glow current in the blocking direction of the diode is substantially reduced, and the glow current in the forward direction of the diode is reduced by the first switch.

In a preferred form of embodiment, the circuit arrangement has a second switch, which is arranged between the converter circuit and the first output terminal, wherein the first switch is arranged between the converter circuit and the second output terminal. The second switch can advantageously further reduce the glow current flowing in the light-emitting diode string.

In another form of embodiment, the circuit arrangement has a second diode, which is arranged between the converter circuit and the first output terminal, wherein the first switch is arranged between the converter circuit and the second output terminal. The second diode also advantageously reduces the glow current.

In a specifically preferred form of embodiment of the circuit arrangement, the second switch is a MOSFET and the second diode is the body diode of the MOSFET. This has an advantage, in that the glow current is reduced, and efficiency can simultaneously be improved, as the body diode replaces the diode which would otherwise be present in this location and, when the transistor is switched-in, power losses in the diode are obviated accordingly.

In a particularly advantageous form of embodiment of the circuit arrangement, a parallel-connected arrangement of a first Y-capacitor and a first resistor is connected between ground potential and one terminal of the first switch. The parallel-connected arrangement of the first Y-capacitor and the first resistor raises the potential of the terminal of the first MOSFET switch to a higher level, such that the stray capacitance thereof is reduced, thereby resulting in an advantageous reduction of the glow current.

In another form of embodiment of the circuit arrangement, advantageously, a series-connected arrangement of a varistor and a voltage-dependent switching element is connected in parallel with the first switch. This results in a further reduction in the glow current, in comparison with the form of embodiment of a parallel varistor which is known from the prior art, on the grounds that, by means of the voltage-dependent switching element, the somewhat low impedance of the varistor does not come into effect, and the glow current is strongly suppressed by the varistor.

In a particularly advantageous form of embodiment of the circuit arrangement, a parallel-connected arrangement of a second Y-capacitor and a second resistor is connected between ground potential and one terminal of the second switch. The parallel-connected arrangement of the second Y-capacitor and the second resistor raises the potential of the terminal of the second MOSFET switch to a higher level, such that the stray capacitance thereof is reduced, thereby resulting in an advantageous reduction of the glow current.

In a further form of embodiment of the circuit arrangement, a series-connected arrangement of a second varistor and a second voltage-dependent switching element is connected in parallel with the second switch. This results in a further reduction in the glow current, in comparison with the form of embodiment of a parallel varistor which is known from the prior art, on the grounds that, by means of the voltage-dependent switching element, the somewhat low impedance of the varistor does not come into effect, and the glow current is thus strongly suppressed by the varistor.

In another form of embodiment of the circuit arrangement, the voltage-dependent switching element is a silicon diode for alternating current (SIDAC). SIDACs are rather cost-effective components, which are highly suitable for application in this context.

In another form of embodiment of the circuit arrangement, the voltage-dependent switching element is a transient-voltage-suppression diode (TVS diode). These components are also appropriate for the intended application, wherein they have a higher current and power transmission capacities than SIDACs.

In another form of embodiment of the circuit arrangement, the voltage-dependent switching element is a spark gap. Spark gaps are exceptionally fast-acting and robust, and are thus highly appropriate for the intended application, but have disadvantages with respect to cost.

In a particularly preferred form of embodiment of the circuit arrangement, the converter circuit incorporates a half-bridge comprised of two transistors, wherein the upper bridge transistor is controlled by means of a driver circuit and the second switch, according to this embodiment, is controlled by means of the same driver circuit. A further driver circuit can advantageously be omitted accordingly, thereby saving costs.

In a further form of embodiment of the circuit arrangement, the second switch is controlled by means of the driver circuit, a diode and a sample-and-hold circuit. The sample-and-hold circuit assumes the desired switching device function of the second switch in a particularly advantageous manner, wherein the diode executes the requisite rectification.

Other advantageous further developments and configurations of the circuit arrangement according to the present disclosure for the operation of semiconductor light sources proceed from further dependent claims, and from the following description.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
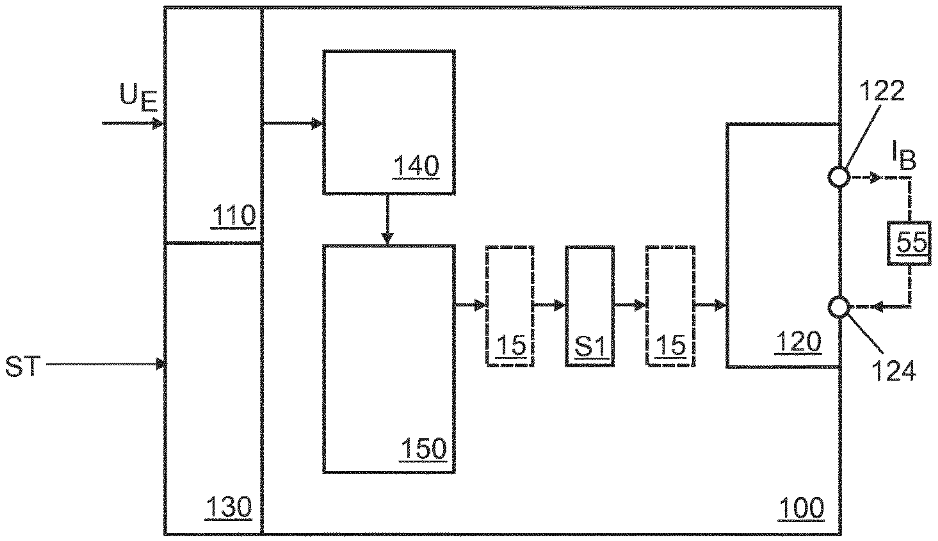
FIG. 1 shows a schematic circuit diagram of one form of embodiment of the circuit arrangement for operating semiconductor light sources.
Figure 2:
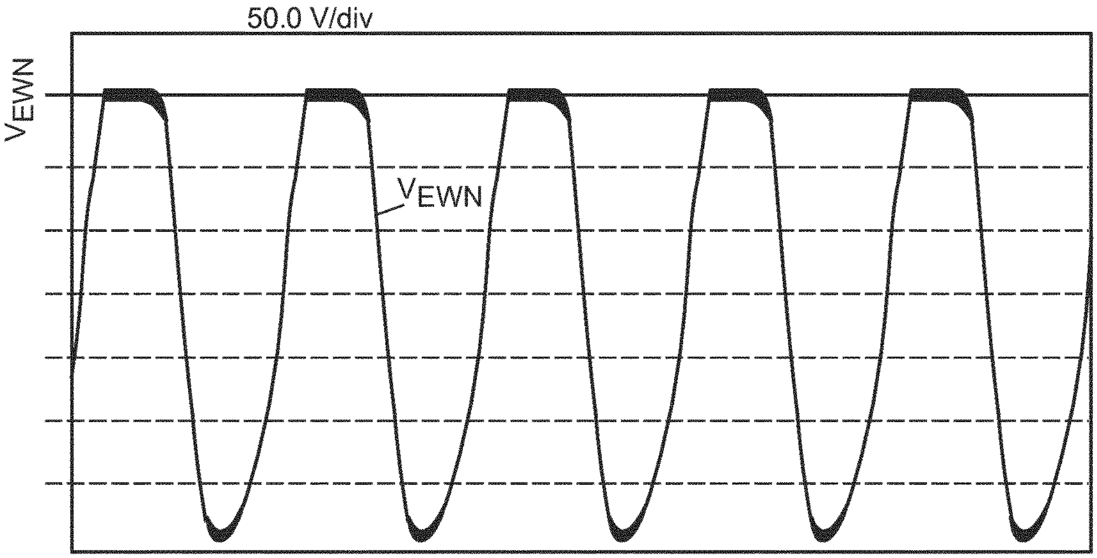
FIG. 2 shows a voltage which, notwithstanding a switched-out LED module, is present on the LED string, thus resulting in the glowing of the LEDs 5 in the LED string 55.
Figure 3:
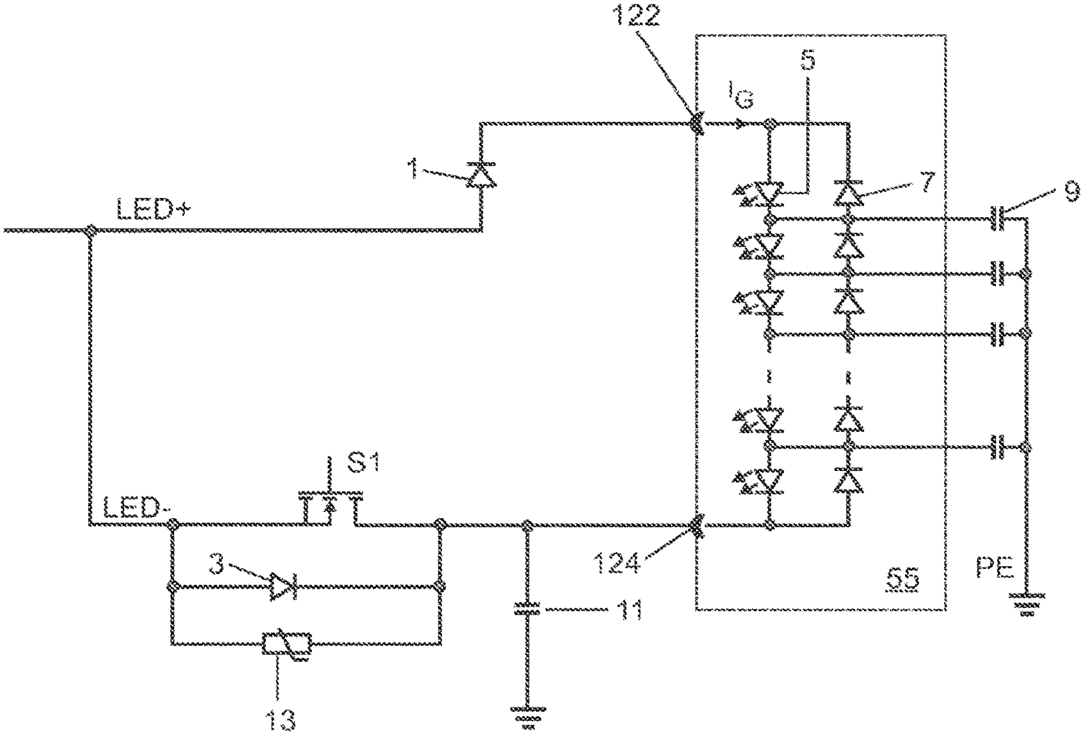
Fig. 3 (Prior Art)
FIG. 3 shows a circuit arrangement according to the prior art, which reduces the glowing of the LEDs 5.

FIG. 1 shows a schematic circuit diagram of one form of embodiment of the circuit arrangement 100 for operating semiconductor light sources. The circuit arrangement 100 for operating semiconductor light sources has an input 110 for the inputting of an AC input voltage $U_E$. The circuit arrangement 100 for operating semiconductor light sources is permanently connected to this AC input voltage $U_E$, and is switched-in and switched-out by means of a control input 130. Via the control input 130, on a bus ST, in addition to switching commands, dimmer commands, for example, can also be transmitted to the circuit arrangement 100. The input 110 is connected to a rectifier circuit 140, which converts the AC input voltage $U_E$ into a DC voltage. The DC voltage is transmitted to a DC voltage converter 150, which converts the DC voltage into an appropriate direct current $I_B$ for a light-emitting diode string which is connected to the circuit arrangement 100 for operating semiconductor light sources. This direct current $I_B$ is fed via a first switch S1 and a first diode 15 to the output 120 of the circuit arrangement 100 for operating semiconductor light sources. The light-emitting diode string 55 is connected between the first output terminal 122 and the second output terminal 124 of the output 120 of the circuit arrangement 100 for operating semiconductor light sources. The first diode 15 can thus be connected in series between the first switch S1 and the output 120, or between the DC voltage converter 150 and the first switch S1. However, the diode can also be arranged directly on the module of the light-emitting diode string 55. Upon installation in a light fitting, the diode would then be arranged in said light fitting. The diode is advantageously connected in series between the first switch S1 and the output 120. Due to the fact that the circuit arrangement 100 for operating semiconductor light sources is permanently connected to the AC input voltage $U_E$, the light-emitting diodes 5 can commence to glow, even though the circuit arrangement 100, and thus also the DC voltage converter 150, is switched-out by the control signal ST via the control input 130.

Figure 4:
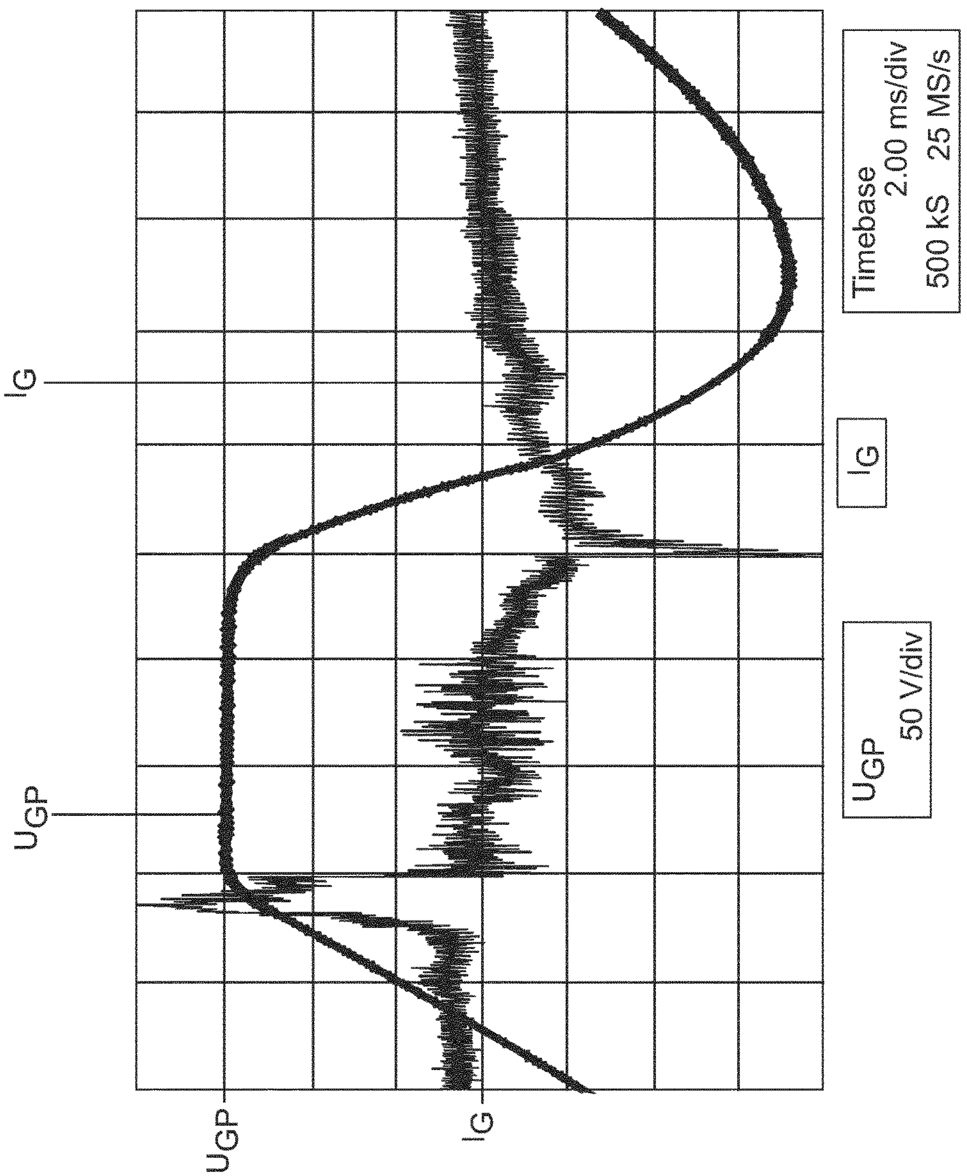
FIG. 4 represents a stray voltage $U_{GP}$, which induces a glow current $I_G$ in the LEDs 5.
Figure 6:
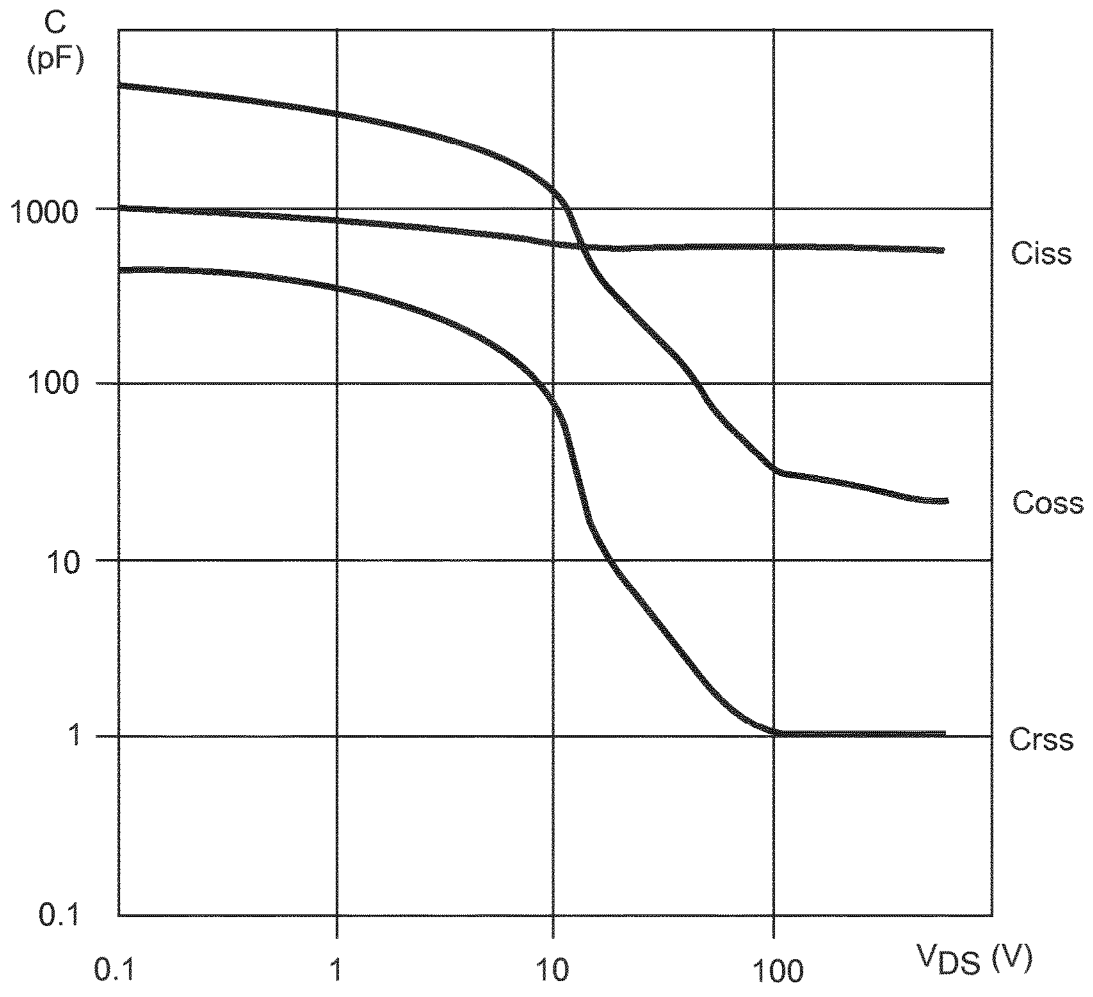
FIG. 6 shows a diagram of the stray capacitance Coss of a MOSFET plotted against the drain-source voltage VDS thereof.

FIG. 4 shows the representation of a stray voltage $U_{GP}$ plotted against time, which induces a glow current $I_G$ in the LEDs 5. By the application of the aforementioned known measures, notwithstanding the high stray voltage $U_{GP}$, the glow current $I_G$ is very small, but is nevertheless perceptible, particularly in a dark environment. The two current peaks of the glow current $I_G$ can clearly be seen on the edge slopes of the stray voltage $U_{GP}$. These are associated with two effects:

1. A high glow current is generated by a large voltage variation in the stray voltage $U_{GP}$, thereby reducing the impedance of the circuit considered, and thus increasing the current flow in the LEDs.
2. A high stray capacitance is present across the drain-source gate of the MOSFET S1, in the event of low voltages across this gate, as can be seen in FIG. 6. This high stray capacitance constitutes a not insignificant impedance, via which a glow current $I_G$ can flow, thereby increasing the glow current which is already flowing in the varistor 13.

In one form of embodiment, a resistor 10 is arranged in parallel with the Y-capacitor 11, in order to increase the voltage across the drain-source gate of the MOSFET S1.

Figure 5:
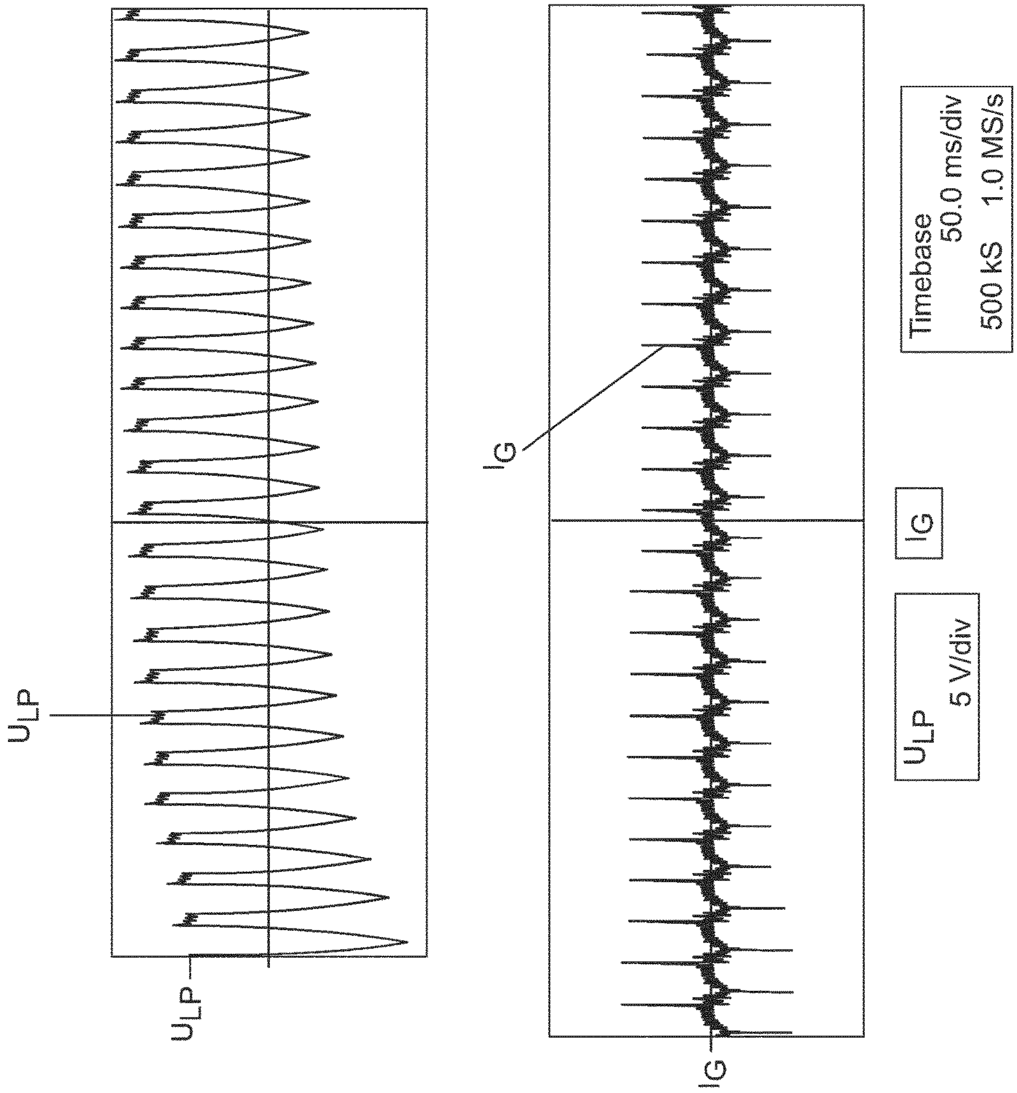
FIG. 5 shows the action of a resistor 10 arranged in parallel with the Y-capacitor 11, resulting in a reduction of the glow current $I_G$.

FIG. 5 illustrates the action of the resistor 10, connected in parallel with the Y-capacitor 11, which results in a reduction of the glow current $I_G$. An increase in the voltage on the drain-source gate of the MOSFET S1 from 0V to approximately 10V reduces the stray capacitance thereof from 5 nF to approximately 1.5 nF. The voltage ULP in FIG. 5 is the voltage on the LED− terminal. In the course of the time characteristic, this voltage is raised by the resistor 10. In the lower half of FIG. 5, the glow current $I_G$ is illustrated. A drop in the glow current is clearly perceptible, from approximately 19 μA to approximately 13 μA.

FIG. 6 shows a diagram of the stray capacitance COSS of a MOSFET, plotted against the drain-source voltage VDS of the MOSFET. It can clearly be seen that the capacitance of the drain-source gate becomes smaller, the greater the voltage across said gate. This results in the aforementioned drop in the glow current $I_G$, as the impedance also becomes greater as the capacitance reduces. Repeated in other terms, as a result of the resistor arranged in parallel with the Y-capacitor, the voltage across the drain-source gate of the MOSFET S1 rises, and the stray capacitance reduces accordingly. In consequence, the impedance of this drain-source gate rises, and the glow current associated with the latter reduces correspondingly.

Figure 7:
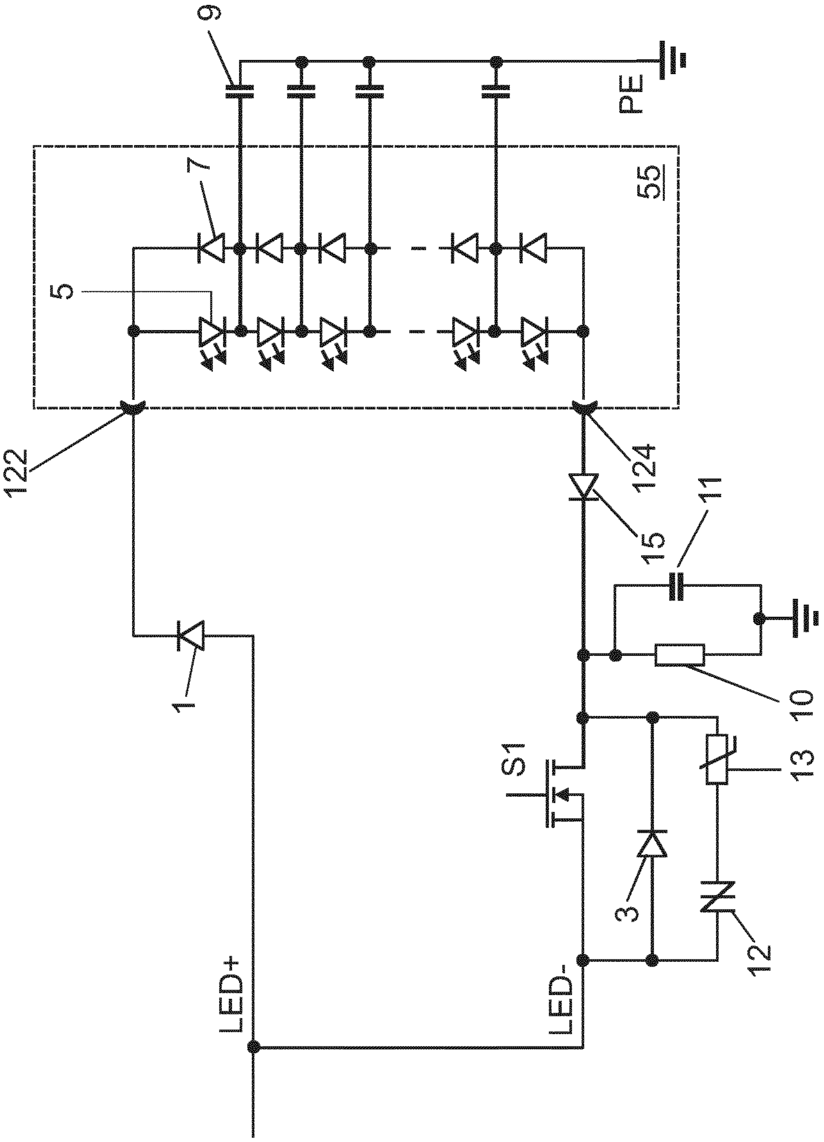
FIG. 7 shows a first form of embodiment of the circuit arrangement according to the present disclosure for reducing the glow of a LED string.

FIG. 7 shows a first form of embodiment of the circuit arrangement according to the present disclosure for the reduction of the glow of a LED string. This first form of embodiment has a second diode 1, which is already known from the prior art, arranged between the LED+ terminal and the first output terminal 122. In the first form of embodiment, the two problems described above have been addressed, in order to further reduce the glow current, in comparison with the known circuit arrangement from the prior art. According to the present disclosure, a first diode 15 is connected in series between the second output terminal (124) and the switch S1. By this measure, the glow current flowing from the switch S1 in the direction of the LED terminal 124 is virtually suppressed. Consequently, a glowing of the LEDs 5 is no longer visible.

As the first diode 15 also has a stray capacitance, a voltage across the other components described cannot be entirely ruled out either.

Consequently, as a further measure, the aforementioned resistor 10 is connected in parallel with the Y-capacitor 11. The Y-capacitor 11 is connected between ground potential and the connection point of the cathode of the diode 15 and the source terminal of the MOSFET S1. However, the Y-capacitor can also be connected between ground and the anode of the diode 15. The resistor 10 results in the aforementioned voltage increase across the drain-source gate of the MOSFET S1, with a consequent reduction in the stray capacitance, thereby resulting in an increase in impedance.

As a further measure, in the first form of embodiment, a SIDAC is connected in series with the varistor 13, which is intended to reduce the current flowing in the varistor, as a result of the relatively low resistance of the varistor 13. A SIDAC is a voltage-dependent switch, which is not conductive below a certain voltage threshold, such that no significant current can flow in the circuit thereof. In place of a SIDAC, another voltage-dependent switch, such as a TVS diode or a spark gap, can also be arranged. By this measure, the protective action in response to surge pulses is also improved, as the voltage-dependent switch is also capable of absorbing the energy of such a surge pulse. It is only important that the voltage-dependent switch, below its threshold voltage, should show the maximum possible impedance.

Figure 8:
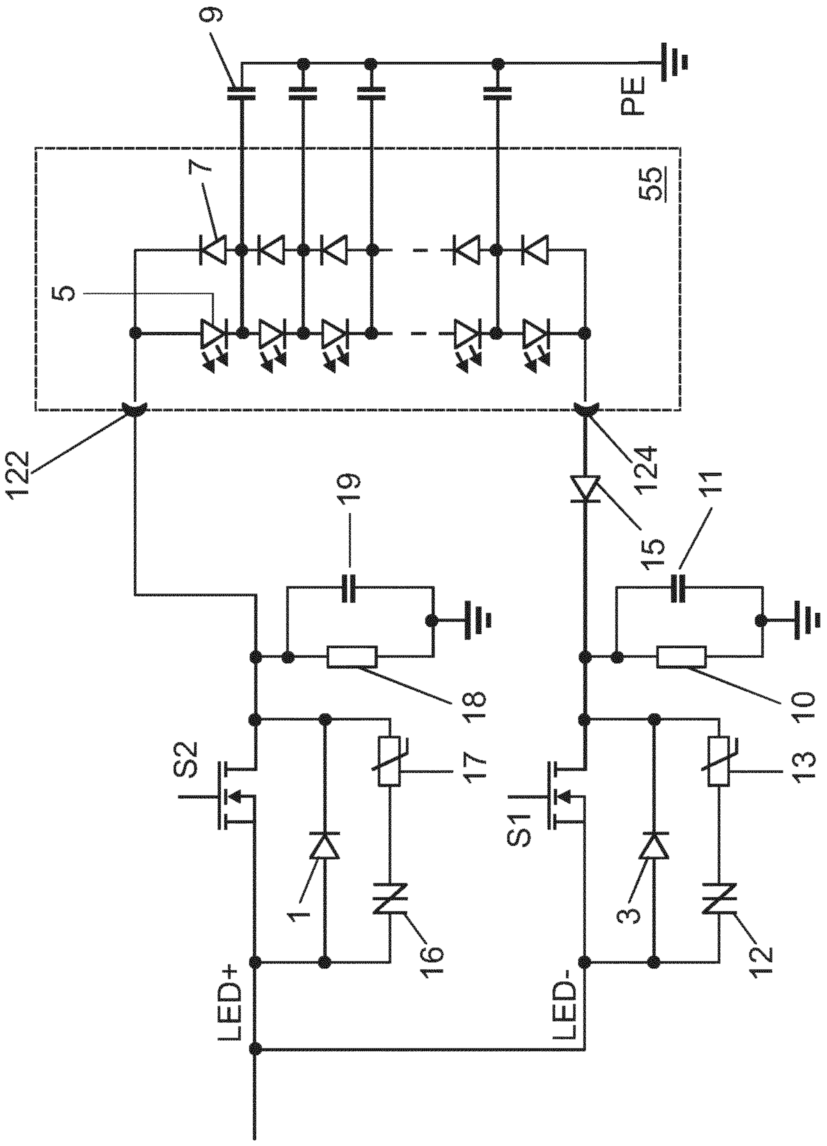
FIG. 8 shows a second form of embodiment of the circuit arrangement according to the present disclosure for reducing the glow of a LED string.

FIG. 8 shows a second form of embodiment of the circuit arrangement according to the present disclosure for the reduction of the glow of a LED string. The second form of embodiment is similar to the first form of embodiment, in consequence whereof only the differences from the first form of embodiment will be described.

As a result of the additional components for the reduction of the glow current flowing in the LEDs, additional losses occur in the circuit arrangement according to the present disclosure for the reduction of glow. These losses can be reduced by a second switch S2, also configured in the form of a MOSFET. The second switch S2 is thus connected in parallel with the second diode 1. However, this measure results in a significant increase in the glow current. With the converter switched-out, the second switch S2 in the form of a MOSFET assumes a blocking state, thereby reducing the flux of a glow current $I_G$. The MOSFET S2 is connected between the DC voltage converter 150 and the light-emitting diode string 55, such that the drain terminal of the MOSFET S2 is coupled to the light-emitting diode string 55, and the source terminal of the MOSFET S2 is coupled to the DC voltage converter 150. Thus, the body diode of the MOSFET S2, which is still present, becomes the second diode 1. In service, the MOSFET S2 is operated inversely, as the light-emitting diode current $I_B$ flows from the DC voltage converter 150 to the light-emitting diode string 55. The MOSFET, in comparison with the known second diode 1, also improves the efficiency of the circuit arrangement, on the grounds that, at high currents, it generates significantly lower losses than the bipolar diode previously employed in this location.

Here again, analogously to the MOSFET S1, a series-connected arrangement of a varistor 17 and a SIDAC 16 is connected in parallel with the drain-source gate, which protects the MOSFET S2, but which simultaneously permits no high stray current.

In order to reduce the glow current associated with the stray capacitance of the MOSFET S2, the drain potential, as in the case of the MOSFET S1 is likewise increased. To this end, between ground and the drain potential of the MOSFET S2, a resistor 18 is incorporated, which increases the voltage across the drain-source gate of the MOSFET S2. In parallel with the resistor 18, a Y-capacitor 19 is again arranged, which reduces the voltage rise on the LED+ terminal 122, in relation to the ground potential, thereby also reducing the glow current.

In this form of embodiment, a problem arises, in that the MOSFET S2 cannot be controlled in a simple manner, on the grounds that it is configured in an "overhead" arrangement, and the requisite potential can consequently not be generated by simple means. Consequently, a control circuit is employed in this form of embodiment, which eliminates this problem.

Figure 9:
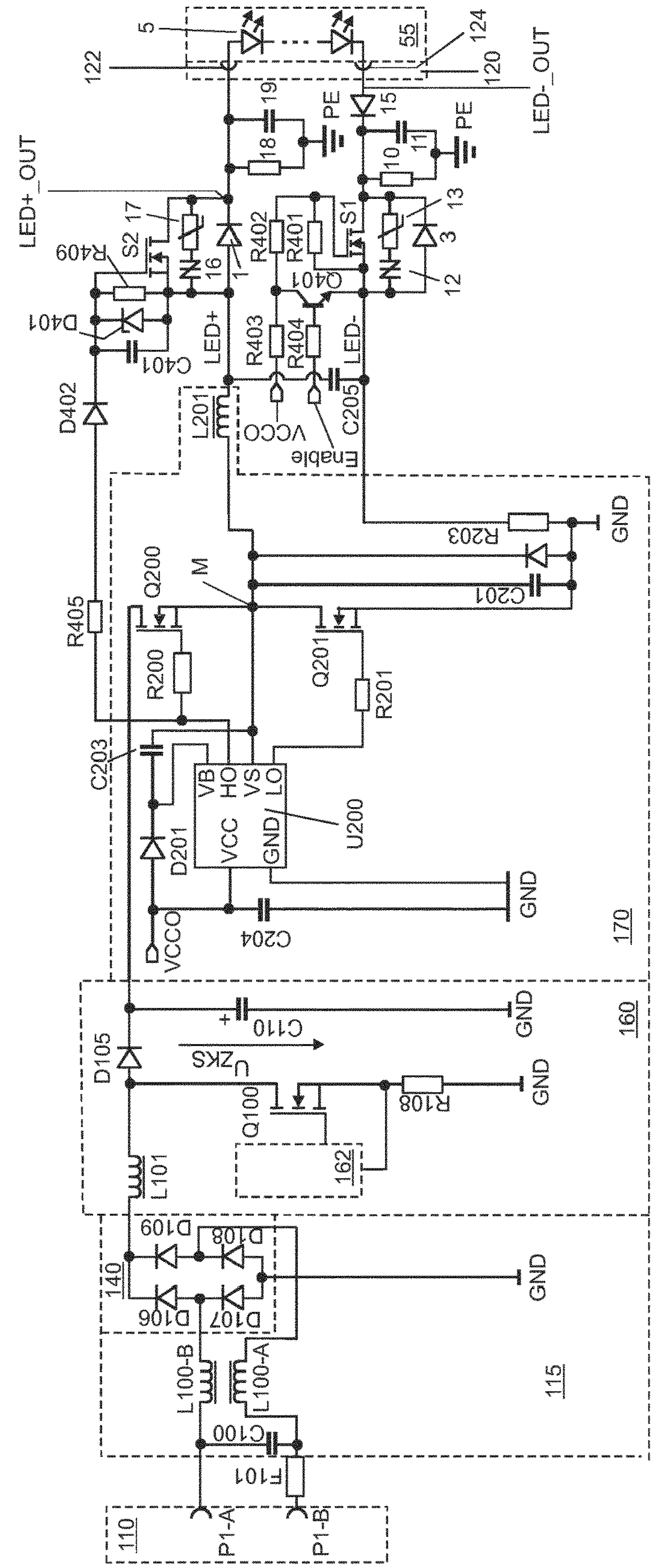
FIG. 9 shows a control circuit for a MOSFET in the second form of embodiment of the circuit arrangement according to the present disclosure for reducing the glow of a LED string.

FIG. 9 shows the complete power circuit of the second form of embodiment of the circuit arrangement according to the present disclosure. The relevant functional modules of the power circuit are briefly described hereinafter.

The circuit arrangement is supplied with an AC mains voltage via the input terminals P1-A and P1-B. These constitute the power input 110. The function of the fuse F101 is the protection of the circuit arrangement against unacceptable states. The components L-100-A and L-100-B, together with the capacitor C100, constitute an input filter 115, which serves for the conditioning of the AC voltage signal. The conditioned AC voltage is fed to a bridge rectifier 140 comprised of the diodes D106 to D109.

The rectified AC voltage is present on a power factor correction circuit 160 comprised of the components L101, Q100, D105 and an intermediate circuit back-up capacitor C110. The resistor R108 constitutes a shunt for the current measurement of the converter current on the power factor correction circuit 160. The transistor Q100 is controlled by means of a control circuit 162, which measures the current flowing in the resistor R108 as a parameter. The control circuit 162 controls the switch Q100, such that compliance with applicable standards for the power factor of the circuit arrangement is maintained. The power factor correction circuit 160 delivers an intermediate circuit voltage $U_{ZKS}$. The intermediate circuit voltage $U_{ZKS}$ is fed to a step-down half-bridge 170, which steps down the intermediate circuit voltage $U_{ZKS}$ and delivers a current $I_B$ for the light-emitting diode string 55. The step-down half-bridge 170 includes two half-bridge switches Q200 and Q201, which are configured as MOSFETs.

The source terminal of the lower MOSFET Q201 is connected to ground. A current measuring shunt R203 is connected to ground at one end. The other end of the resistor R203 forms the first output LED− of the step-down half-bridge 170.

The two MOSFETs Q200 and Q201 are connected in series, and constitute a half-bridge mid-point M, which is connected to a filter choke L201. The other end of this filter choke L201 constitutes the second output LED+ of the step-down half-bridge 170. Between the first output LED- and the second output LED+, a capacitor C205 is connected. The power factor correction circuit 160 and the step-down half-bridge 170, in combination, constitute the converter circuit 150.

Between the first output LED- and the output terminal 124, which is coupled to the light-emitting diode string 55, the first switch S1 is arranged, which is likewise configured as MOSFET. The first switch is controlled by a control circuit, which switches the MOSFET S1 via a bipolar transistor Q401. To this end, an enable signal, supported by an auxiliary voltage signal VCCO is employed, which is generated by an auxiliary voltage supply which is not represented here. The resistors R401 and R402 constitute a voltage divider, which supplies the gate of the MOSFET S1 with the requisite switching voltage. The bipolar transistor Q401 is connected in parallel with this voltage divider, and can short-circuit the voltage divider, such that the MOSFET S1 is switched-out. The function of the resistor R403 is the decoupling of the auxiliary voltage supply VCCO. As the bipolar transistor Q401, with its emitter, is connected to the LED conductor, it can easily be switched, via its base, by means of the enable signal with a customary control level. The function of the resistor R404 is the decoupling of this control level. A diode 15 is arranged between the first switch S1 and the output terminal 124. The enable signal is controlled by the control input 130 and, according to the dictates of the control signal ST (e.g. light-emitting diodes on/off), is switched accordingly.

The diode 15 is connected such that its cathode is directed towards the cathode of the body diode of the MOSFET switch S1. The diode 15 is thus connected in an “antiserial” arrangement to the body diode of the MOSFET switch S1. This measure ensures a strong reduction in the glow current, as the resulting interconnection of S1 and the diode 15 constitutes a four-quadrant switch. At the coupling point of the cathode of the diode 15 with the drain terminal of the MOSFET switch S1, a parallel-connected arrangement of a resistor 10 and a Y-capacitor 11 is connected. The other end of this parallel-connected arrangement is connected to ground. However, the parallel-connected arrangement can also be connected between the anode of the diode 15 and ground. The resistor 10, as in the first form of embodiment, effects a rise in the potential of the drain-source gate of the MOSFET switch S1, such that the residual glow current of the circuit arrangement is further reduced as a result.

Between the second output LED+ and the output terminal 122, which is connected to the light-emitting diode string 55, the second switch S2 is arranged, which is also configured as a MOSFET. The function of the second switch is the bridging of the second diode 1. Given that, particularly in the event of higher currents $I_B$ flowing in the light-emitting diode string 55, an increased power loss occurs on the diode 1, the latter is bridged by means of the second switch S2, in order to reduce this power loss. As already described, the MOSFET S2 is connected such that its source terminal is coupled to the LED+ terminal, and its drain terminal is coupled to the first output terminal 122. Between the drain terminal and ground, a parallel-connected arrangement of a Y-capacitor 19 and a resistor 18 is connected. Here again, the resistor generates a rise in the potential of the source terminal of the MOSFET S2, in order to reduce the stray capacitance thereof. On the grounds of the connection thereof, the MOSFET S2 is operated inversely. As the MOSFET S2 is coupled to half-bridge mid-point, it can no longer be controlled by means of the customary ground-related low voltage level. The second form of embodiment of the circuit arrangement according to the present disclosure, for the control of the MOSFET S2, employs the circuit procedure described hereinafter.

The step-down half-bridge 170, for the control of the upper transistor Q200, requires a “high-side driver”, i.e. an auxiliary circuit which can actuate the upper transistor with the requisite potential for the switching thereof. As the upper MOSFET Q200 carries the intermediate circuit voltage $U_{ZKS}$, the control potential thereof must lie above this voltage. This auxiliary circuit is also employed in a simple and cost-effective manner for the control of the switch S2. The two half-bridge transistors Q200 and Q201 are controlled by an integrated circuit U200, via the resistors R200 and R201. The high-side driver is integrated in this integrated circuit U200. The signal for the upper transistor Q200 is delivered on the output HO of the integrated circuit U200. The signal for the lower transistor is delivered on the output LO of the integrated circuit U200. The half-bridge mid-point M is connected to the terminal VS of the integrated circuit U200. The integrated circuit U200 is likewise supplied, by means of the auxiliary voltage supply which is not represented here, with the voltage VCCO. The components D201 and C203 constitute the external circuit elements of the high-side driver, in order to deliver the corresponding potential for the upper transistor Q200. The high-side driver thus includes the components U200, D201 and C203. The components D201 and C203 are connected in series, and are arranged between the voltage VCCO and the half-bridge mid-point M. The node point between the cathode of the diode D201 and the capacitor C203 is coupled to the terminal VB of the integrated circuit U200.

The output HO of the integrated circuit U200, according to the second form of embodiment, is coupled to a series-connected arrangement of a resistor R405 and a diode D402. The anode of the diode D402 is thus coupled to the resistor R405. The cathode of the diode D402 is coupled to a sample-and-hold circuit, comprised of the components C401, D401 and R409. “Sample-and-hold circuit” is the English term for “Abtast-Halte-Schaltung”. This circuit holds the voltage level of the rectified AC voltage of the high-side driver at a switching voltage which is sufficient for the MOSFET S2. The gate of the MOSFET S2 is thus likewise connected to the cathode of the diode D402 and the sample-and-hold circuit.

By means of the diode D402, the AC voltage signal present on the output HO is rectified, and is applied to the sample-and-hold circuit. In the course of a plurality of full cycles on the step-down half-bridge, the capacitor C401 is thus charged to a voltage, which is limited by the Zener diode D401. This voltage is now applied to the gate of the MOSFET S2, in order to switch-in the latter, provided that the half-bridge comprised of the MOSFETs Q200 and Q201 is in service. If the step-down half-bridge is switched-out, the capacitor C401 is discharged via the resistor R409, and the MOSFET S2 is switched-out. It should be observed that the transistor will only be switched-in after a number of operating cycles of the half-bridge. However, this does not constitute a disadvantage, on the grounds that, during these cycles, the body diode 1 is active, and carries the current flowing in the light-emitting diode string 55. Although this is associated with an increased power loss, this only applies over a few cycles of the step-down half-bridge, and thus does not constitute a problem in practice. Depending upon the rating of the resistor R409, the MOSFET S2 remains switched-in for some time after the switch-out of the step-down half-bridge, until the capacitor C401 is discharged below the threshold voltage of the MOSFET S2. Again, in practice, only a very short time interval is involved, such that this does not pose any problem. By this arrangement, the transistor S2 can be switched by simple and cost-effective means, without the requirement for a further and complex high-side driver.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCE SYMBOLS

1 second diode
3 body diode
5 light-emitting diode
7 protective diode
9 stray capacitance
10 resistor
11 Y-capacitor
12 SIDAC
13 varistor for the protection of the MOSFET S1
15 first diode
55 light-emitting diode string
100 circuit arrangement for operating semiconductor light sources
110 power input for inputting an AC input voltage
115 input filter
120 output
122 first output terminal
124 second output terminal
130 control input
140 rectifier circuit
150 converter circuit
160 power factor correction circuit
162 control circuit of power factor correction circuit
170 step-down half-bridge
S1 first switch, configured as a MOSFET
S2 second switch, configured as a MOSFET
PE ground
LED+ positive LED conductor to first output terminal
LED− negative LED conductor to second output terminal
C110 intermediate circuit back-up capacitor

The invention claimed is:

1. A circuit arrangement for operating semiconductor light sources comprising:
- a power input for inputting an AC input voltage,
- an output having a first output terminal, and a second output terminal, which is designed to connect a string of semiconductor light sources,
- a control input for controlling the operation of the circuit arrangement with a control signal,
- a rectifier circuit for converting the AC input voltage into a rectified voltage,
- a converter circuit for transforming the rectified voltage into a current which is suitable for the semiconductor light sources,
- a first switch arranged between the converter circuit and the output, for the switching of the current through the semiconductor light sources,
- a first diode arranged between the first switch and the output, and
- a second switch which is arranged between the converter circuit and the first output terminal, wherein the first switch is arranged between the converter circuit and the second output terminal.

2. The circuit arrangement as claimed in claim 1, further comprising a second diode, which is arranged between the converter circuit and the first output terminal, wherein the first switch is arranged between the converter circuit and the second output terminal.

3. The circuit arrangement as claimed in claim 2, further comprising a second switch; wherein the second switch is a MOSFET, and the second diode is a body diode of the MOSFET.

4. The circuit arrangement as claimed in claim 1, further comprising a parallel-connected arrangement of a first Y-capacitor and a first resistor, which is connected between ground potential and one terminal of the first switch or the first diode.

5. The circuit arrangement as claimed in claim 1, further comprising a series-connected arrangement of a first varistor and a first voltage-dependent switching element, which is connected in parallel with the first switch.

6. The circuit arrangement as claimed in claim 5, wherein the first voltage-dependent switching element is a silicon diode for alternating current (SIDAC).

7. The circuit arrangement as claimed in claim 5, wherein the first voltage-dependent switching element is a transient-voltage-suppression diode (TVS diode).

8. The circuit arrangement as claimed in claim 5, wherein the first voltage-dependent switching element is a spark gap.

9. The circuit arrangement as claimed in claim 1, further comprising
- a parallel-connected arrangement of a second Y-capacitor and a second resistor, which is connected between ground potential and one terminal of the second switch.

10. The circuit arrangement as claimed in claim 1, further comprising
- a series-connected arrangement of a second varistor and a second voltage-dependent switching element, which is connected in parallel with the second switch.

11. The circuit arrangement as claimed in claim 10, wherein the second voltage-dependent switching element is a silicon diode for alternating current (SIDAC).

12. The circuit arrangement as claimed in claim 10, wherein the second voltage-dependent switching element is a transient-voltage-suppression diode (TVS diode).

13. The circuit arrangement as claimed in claim 10, wherein the second voltage-dependent switching element is a spark gap.

14. The circuit arrangement as claimed in claim 1, wherein the converter circuit incorporates
- a half-bridge comprised of two transistors, wherein the upper bridge transistor is controlled by means of a driver circuit, wherein the second switch is controlled by means of the same driver circuit.

15. The circuit arrangement as claimed in claim 14, wherein the second switch is controlled by means of the driver circuit, a diode and a sample-and-hold circuit.

16. A circuit arrangement for operating semiconductor light sources comprising:
- a power input for inputting an AC input voltage,
- an output having a first output terminal, and a second output terminal, which is designed to connect a string of semiconductor light sources,
- a control input for controlling the operation of the circuit arrangement with a control signal,
- a rectifier circuit for converting the AC input voltage into a rectified voltage,
- a converter circuit for transforming the rectified voltage into a current which is suitable for the semiconductor light sources,
- a first switch arranged between the converter circuit and the output, for the switching of the current through the semiconductor light sources,
- a first diode arranged between the first switch and the output, or between the converter circuit and the first switch, and a series-connected arrangement of a first varistor and a first voltage-dependent switching element, wherein the series-connected arrangement is connected in parallel with the first switch.

* * * * *